(12) United States Patent
Hsiung et al.

(10) Patent No.: US 6,590,409 B1
(45) Date of Patent: Jul. 8, 2003

(54) SYSTEMS AND METHODS FOR PACKAGE DEFECT DETECTION

(75) Inventors: Steve K. Hsiung, Fremont, CA (US); Kevan V. Tan, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/023,311

(22) Filed: Dec. 13, 2001

(51) Int. Cl.[7] .................. G01R 31/26; G01R 31/00; H01L 21/66
(52) U.S. Cl. .................. 324/765; 324/501; 438/14; 438/15; 438/16
(58) Field of Search .................. 324/501, 754, 324/534, 719, 765, 751, 750; 250/371; 438/14, 15, 16, 17

(56) References Cited

U.S. PATENT DOCUMENTS 6,395,580 B1 * 5/2002 Tseng .................. 438/108
6,451,631 B1 * 9/2002 Grigoropoulos et al. .... 438/149
6,455,334 B1 * 9/2002 Goruganthu et al. .......... 438/14

* cited by examiner

*Primary Examiner*—N. Le
*Assistant Examiner*—Donald M Lair
(74) *Attorney, Agent, or Firm*—Conley, Rose & Tayon

(57) ABSTRACT

A charged particle imaging system may be used to perform package-level failure analysis by providing a Capacitive Coupling Voltage Contrast image of a portion of the semiconductor package. Preliminary failure analysis using Time Domain Reflectometry may determine whether a defect lies either outside or within the semiconductor package substrate. The semiconductor package may be prepared such that sequential layers of the package may be removed until electrical testing determines the location of a defect on a layer of the package. An alternating signal may be supplied to an exposed trace conductor on the layer of the package substrate on which the defect is located. A portion of the trace conductor may be imaged with a charged particle imaging system to produce a voltage-induced contrast image of the trace conductors.

22 Claims, 6 Drawing Sheets

SYSTEMS AND METHODS FOR PACKAGE DEFECT DETECTION

BACKGROUND OF THE INVENTION

1. Field of the Invention

This invention relates to package-level failure analysis and, more particularly, to defect localization in packaged integrated circuit subsystems.

2. Description of the Related Art

The following descriptions and examples are not admitted to be prior art by virtue of their inclusion within this section.

Until recently, the ongoing quest of the semiconductor industry was to improve the performance of integrated circuits ("ICs") before the integrated circuit was placed into a package and hermetically sealed from the environment. However, advancements in the performance in integrated circuits may now be limited by the technology by which the circuits are packaged. Improving packaging of integrated circuits may involve increasing the package density (i.e., pin-out) and improving the package performance (i.e., electrical conductance and signal speed).

Device failure or performance impairment can occur if a trace conductor, or group of trace conductors, is not properly conducting electrical signals due to a defect in the trace conductor. There are two basic types of defects that may occur when trace conductors are formed. Missing material defects may occur when a conductive structure is formed which is missing some portion of its conductive material. Such a defect may cause the formation of an "open" structure, or break in the conductive pathway of the trace conductor, and is indicated by a measurement of large electrical resistance across the trace conductor. There are several ways an open can occur, either at the terminal sites or along the length of a trace conductor. For instance, the solder balls or solder bumps may have been improperly attached or may have experienced critical mechanical strain due to thermal expansion or package mishandling. There may also be micro-cracks, or other breaks, in the terminals or trace conductors within the substrate. There could be manufacturing defects such as, incomplete vias, missing vias, or misaligned vias between the substrate layers. Further, electromigration could cause cracks to form in the solder joints or in the trace conductor pathways within the substrate. Similarly, an extra material defect may occur when a conductive structure includes material extending beyond the predefined boundaries. Such material may extend to another conductive structure causing an electrical "short" to be formed between the two conductive structures. This type of defect may be indicated by a very low resistance measurement between two or more different trace conductors. An example of a defect that causes an electrical short includes dendritic branching between trace conductors.

To test and locate the exact source of an electrical discontinuity of a trace conductor requires the destructive dismantling of the package and is typically a final step in failure analysis of such devices. A trace conductor, or group of trace conductors, associated with a failing I/O pin will first be pinpointed as a source of electrical pathway discontinuity by preliminary failure analysis testing. Subsequently, localization of the defect may be performed by one of several techniques, such as optical inspection, electrical testing, or other non-destructive evaluations.

One such method for isolating defects in package substrates involves optical inspection. Once a defect is located visually, it is often necessary to test the electrical continuity of the trace by mechanical probing. This is accomplished by first removing the semiconductor chip so as to expose the solder bumps encapsulated in the underfill material beneath the IC. An electrical testing device such as a multi-meter can then be used to measure the resistance of the trace conductor by connecting the two probe wires of the meter on either end of the trace conductor. Typically, a probe wire is soldered to the trace conductor solder ball terminal on the underside of the board. The other probe wire may have a probe needle attached for making electrical contact with the exposed solder bump at the upper surface of the board. However, problems may arise using this testing method. The defect may be heat-cured during the solder attachment of the probe wire to the solder ball if the defect is physically located at or in proximity to the solder ball. Furthermore, when a probe wire is soldered to a trace conductor solder ball, undue tension on the bottom probe wire may be caused during the parallel lapping process (used to remove subsequent layers of the substrate), and may pull the solder ball away from the substrate or simply cause the wire or joint to break.

As stated above, package-level failure analysis has traditionally been performed by optical inspection followed by mechanical probing. Conventional optical inspection methods for package defects involve direct bright and dark field microscope optical inspection. However, the trace length of I/O lines, which may be as long as 9 mm, complicates the task of detecting micro-cracks by optical inspection. Furthermore, even if a micro-crack is detected, its causality may not always be certain. Direct inspection of I/O traces and vias using Scanning Electron Microscopy (SEM) is impossible due to surface charging, which may hinder detection of micro-cracks. In addition, even though a defect may be located by optical inspection, it may not be an electrical failure. Thus, mechanical probing is typically performed to test the electrical continuity of the trace conductors.

Accordingly, as I/O routing becomes increasingly dense in multi-layer substrate packages, a method of pinpointing defects may be needed to augment and eventually supplant current techniques. Therefore, it may be beneficial to provide a method for charged particle beam-based voltage contrast imaging for localization and isolation of package-level substrate defects.

SUMMARY OF THE INVENTION

The above outlined problems may be in large part addressed by a voltage-induced contrast imaging technique adapted to supply an electrical signal to a semiconductor package substrate while imaging the substrate with a charged particle beam-based imaging system. The semiconductor package may be a Ball Grid Array (BGA) package designed to receive an integrated circuit. The integrated circuit may be inverted and coupled to the semiconductor package using flip-chip connection techniques. The substrate may be single or multi-layered. The package substrate may include trace conductors arranged between electrical terminals, which may be formed on the package substrate surface. The electrical terminals of the package substrate may be coupled to I/O pins of an integrated circuit by attachment solder bumps.

A test may be conducted prior to removing the IC from the surface of the package substrate. Such testing may include transmitting an electrical pulse along a trace conductor on the surface of the package substrate. Electrical resistance may be measured across the trace conductor to determine whether a defect resides on the surface of the substrate or on an inner layer of the substrate. A failing I/O pin of a semiconductor package may be determined as a source of electrical pathway discontinuity due to a defect in a corresponding trace conductor or group of trace conductors. The package may be prepared for preliminary failure analysis by removing the overlying integrated circuit to expose attachment solder bumps configured within underfill material. If the substrate is a multi-layer substrate, upper layers may be sequentially removed. Measuring the electrical continuity between the trace conductors associated with a failing I/O pin may indicate a defect on a layer of the package substrate.

The package substrate may be mounted in a test fixture. The test fixture may be adapted to expose a backside surface of the substrate to a moveable probe pin attached to a lower part of the fixture. The probe pin may contact an electrical terminal on the back surface of the substrate while a probe needle contacts the corresponding electrical terminal of the trace conductor on a front side surface of the substrate. A test device may be connected between the probe pin and the probe needle and may be used for testing the trace conductor electrical properties. For example, the test device may be a multi-meter configured to measure the electrical resistance of the trace conductor between two layers of the package substrate. If testing measures a low inter-level resistance, a subsequent layer of the package substrate may be removed, and a trace conductor on the underlying substrate layer may be electrically tested. In one embodiment, removal of substrate layers may be achieved by mechanical grinding on a polishing wheel. In another embodiment, removal of substrate layers may be achieved by ashing the substrate layer. This process may be repeated until the defect is located on a layer of the package substrate.

Once the defect is located, an upper surface of the substrate may be an upper surface of the layer on which the defect resides. Also, the trace conductors of the layer may be exposed on the upper surface of the substrate. The substrate may be mounted in a load module, and the substrate may be prepared for optical inspection. Once the substrate is loaded into the load module, a charged particle imaging device may be used to image at least a portion of the package substrate. In one embodiment, the charged particle imaging device may be a Focused Ion Beam (FIB) system. In another embodiment, the charged particle imaging device may be a Scanning Electron Microscopy (SEM) system. In this manner, an image of the semiconductor package may be obtained by supplying a beam of charged particles to at least a portion of the package substrate. The beam of charged particles may cause an emission of charged particles in the traces that are conducting electricity, such that emission may cause the conducting traces to appear to brighten. Likewise, traces that are not conducting electricity may absorb charged particles, such that absorption may cause the non-conducting traces to appear to darken. Thus, the brightening and darkening of traces may produce a voltage-induced contrast image of a trace conductor corresponding to a failing pin of an integrated circuit.

The beam-based image may be focused with the beam-based system's internal focusing tools. Upon achieving an acceptable image, an electrical signal may be supplied to the trace conductors on the layer of the substrate in which the defect may be located. The electrical signal may be an alternating signal supplied by a function-generating device. The electrical signal may further be a square wave, having sharp transitional points to create an electrical pulse, which may serve to turn the signal "on" and "off" in an alternating fashion. An acceptable image of the trace conductors during application of the alternating signal may be acquired by altering brightness and contrast parameters with the internal image tools of the beam-based system.

The alternating square-wave signal may produce a toggling effect in the trace conductor. For example, the alternating square-wave signal supplied to the trace conductor on a layer of the package substrate may produce an electrical pulse. The pulse if may vary the electrical signal between on/off states. The "on" state may cause a conducting trace in the image to brighten, while the "off" state may cause a nonconducting trace in the image to darken. Therefore, toggling may indicate that a trace is conducting the electrical signal, whereas a cease in toggling may indicate that a trace is not conducting the electrical signal. In this manner, the cessation of a previously toggling signal may indicate the presence of an electrical open or break in the electrical continuity of the trace. Similarly, simultaneous toggling of two or more electrically conducting traces, having substantially identical contrasts, may indicate an electrical short between the traces. Consequently, a Capacitive Coupling Voltage Contrast (CCVC) image may indicate a defect corresponding to an electrical discontinuity in a trace conductor on a given layer of the package substrate.

An additional embodiment relates to, a method for detecting electrical defects in a semiconductor package. The method may include producing a CCVC image of a portion of the semiconductor package. The method may also include detecting electrical defects using the voltage-induced contrast image produced by the beam-based imaging system. For example, the method may include determining if microcracks in the trace conductor are electrical or non-electrical defects using the voltage-induced contrast image produced by the beam-based imaging system. Producing the image of the portion of the semiconductor package may include applying a signal to a trace conductor of a package substrate of the semiconductor package as described above. The signal may induce a contrast toggling within a trace conductor, which may be imaged with a charged particle imaging device. Such imaging may create a voltage-induced contrast image of at least a portion of the semiconductor package.

In addition to the methods described above, a system configured to detect electrical defects in a semiconductor package is contemplated herein. The system may include a charged particle imaging device configured to produce an image of a portion of the semiconductor package. The system may also include a function generator configured to supply a signal to a trace conductor on a portion of the semiconductor package. The signal from the function generator may be an alternating signal, and more particularly, the signal may be a square wave. The signal may be supplied to the trace conductor while imaging a portion of the semiconductor package with the charged particle imaging device. The image produced by the charged particle imaging device may include a brighter trace conductor if the trace conducts the signal, and may include a darker trace conductor if the trace does not conduct the signal. In this manner, the charged particle imaging device may be further configured to produce a voltage-induced contrast image of the trace conductor. The function generator may also be coupled to an oscilloscope. The oscilloscope may be configured to monitor the signal supplied to the trace conductor by the function generator.

BRIEF DESCRIPTION OF THE DRAWINGS

Other objects and advantages of the invention will become apparent upon reading the following detailed description and upon reference to the accompanying drawings in which.

Figure 1A:
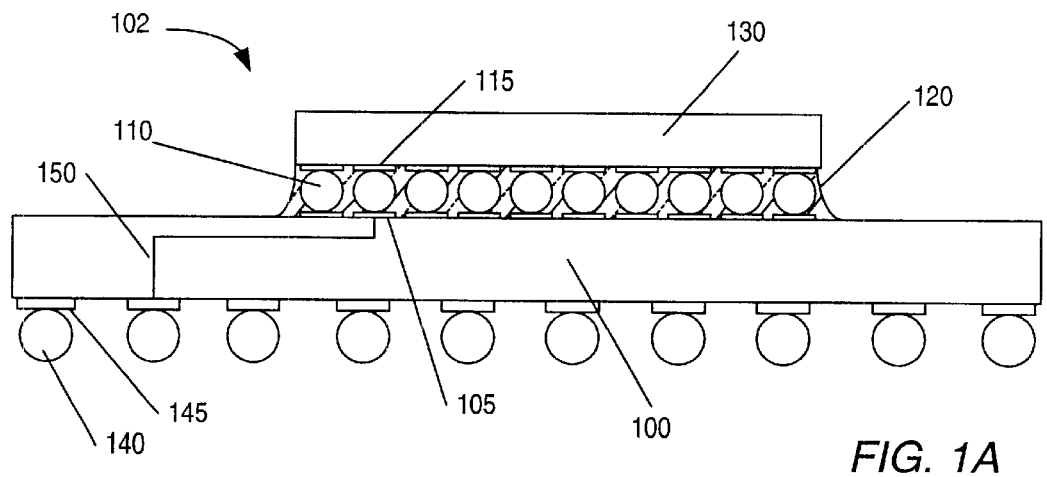
FIG. 1A is a cross-sectional view of an embodiment of a semiconductor package.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

There are several packaging technologies developed to connect IC's to a substrate, namely, wirebond, tape automated bonding (TAB), and flip-chip attach. The drive for faster clock speeds and more densely integrated circuits has led to semiconductor packages that have a higher density of input/output (I/O) pads per chip. Flip-chip package technology such as direct chip attach (DCA), where the chip is directly attached to the board, has evolved to handle these higher I/O density chips. For example, Flip-chip package technology may provide performance and manufacturing solutions such as small package dimensions, high clock speeds, low costs, and suitability for high volume production.

Flip-chip packaging increases the I/O density by arranging the I/O pads of an IC in a two-dimensional array upon a "frontside" surface of the IC instead of having I/O pads on the periphery of the IC device, as in the case of wirebonded packaging. A flip-chip attachment method involves inverting the IC so that the "frontside" surface with I/O pads faces downward onto a substrate such as a printed circuit board (PCB) or multichip module (MCM), which has corresponding sets of bonding pads. A solder bump may be formed upon each of the I/O pads of the IC. During the flip-chip mounting of the IC to the substrate, the solder bumps are placed into physical contact with the bonding pads of the substrate. The solder bumps may be heated long enough for the solder to flow. When the solder cools and hardens, the I/O pads of the IC may be electrically and mechanically coupled to the bonding pads of the substrate. This configuration is also referred to as a "die-down" configuration, since the IC, or die, is facing down towards the substrate.

The substrate, or printed circuit board, may include multiple layers having printed conductors extending across the upper, lower or inner planar surfaces of the board. One or more trace conductors may extend upward from a plane, on which multiple trace conductors are formed, through vias that make contact with the substrate bonding pads. To reduce the mechanical strain on the solder bump attachments, due to a coefficient of thermal expansion mismatch between the substrate material of the board and the integrated circuit, an underfill material may be dispensed in liquid form between the IC and the substrate. The underfill material is typically a thermosetting polymer (e.g., an epoxy resin), which hardens and securely encapsulates the solder bumps that form at the interface of the integrated circuit bonding pads and the substrate bonding pads.

A well-suited package substrate for a flip-chip application is a ball grid array (BGA) substrate. A BGA package substrate may be made of, for example, fiberglass-epoxy printed circuit board material or a ceramic material (e.g., aluminum oxide, alumina, $Al_2O_3$, or aluminum nitride, AlN). Furthermore, the package substrate may be fabricated as a single- or multi-layer substrate. In a flip-chip design application, the substrate includes two sets of bonding pads: a first set on the upper surface of the substrate and a second set on the lower surface of the substrate. Both sets of bonding pads are arranged in a two-dimensional array across the upper and lower surface of the package substrate. The substrate may also include multiple layers including a patterned conductive material forming electrical conductors. In addition, precise drilling may be used to form interlayer vias for electrical and thermal routing through the substrate. The configuration of interlayer vias and intra-layer patterned electrical conductors results in the formation of trace conductors, which electrically connect the first set of bonding pads with the second set of bonding pads on the substrate. Members of the first set of bonding pads on the upper surface of the substrate can be solder bump attached to corresponding I/O bonding pads of an inverted integrated circuit, i.e., "flip-chip." Members of the second set of bonding pads on the lower surface of the substrate function as BGA device package terminals, and are coated with solder. The second set of bonding pads allow the substrate (and trace conductors contained therein connected to corresponding I/O bonding pads) to be surface mounted to a larger printed circuit board (e.g., a motherboard). During board assembly, the BGA package is attached to the corresponding bonding pads on the larger board using standard reflow techniques.

Unlike wire-bond devices, Flip-chip packaged devices may include a heat spreader incorporated onto one side of the package to give maximum thermal dissipation without the use of a heat sink. Removing the heat spreader may render optical inspection of the semiconductor package possible. To remove the heat spreader, a razor blade may be wedged under a corner of the package to separate the heat spreader and the underlying stiffener. The razor blade may be slid through the epoxy material and worked around each corner of the package until the heat spreader may be removed. In addition, the stiffener may be removed. The procedure for removing a stiffener may be similar to that of removing a heat spreader, except that the razor blade may be wedged between the stiffener and the substrate. It is important not to substantially damage the underlying solder mask and substrate surface during stiffener removal. Finally, the die (IC) and substrate may be separated from each other by placing the package in a heater block until the die attach material begins to soften. The package may remain in the heater block for approximately five minutes at a temperature of approximately 350° C. A razor blade may be used to remove the die attach material and to slowly lift the die off the substrate surface.

Turning to the drawings, FIG. 1A is a partial cross-sectional view of an embodiment of semiconductor package 102. Integrated circuit (or chip) 130 may be flip-chip mounted to package substrate 100. Substrate 100 may include multiple, co-planar trace conductors, which may be coupled to each other on distinct layers of the substrate through a via. Chip 130 may be mechanically and electrically attached to substrate 100 by solder bumps 110. Solder bumps 110 may be configured to attach a two-dimensional array of bonding pads 115 of chip 130 with a corresponding array of bonding pads 105 of substrate 100. Bonding pads 105 and 115 may have substantially the same physical layout and may be substantially in registry with each other. When bonded by solder bumps 110, bonding pads 105 and 115 may form an electrical connection between electronic subcomponents within chip 130 and corresponding solder balls 140. Solder bumps 110 may be encapsulated in an underfill layer 120 to lend support and to diminish mechanical strain, which may be caused by a thermal expansion mismatch between chip 130 and substrate 100. Underfill may include any material that is electrically insulative, yet has some thermal conduction capabilities. Substrate 100 may be a multi-layered structure with trace conductors extending from bonding pads 105 on an upper surface of the substrate to corresponding bonding pads 145 on a lower surface of the substrate. Trace conductors within the substrate may carry electrical signals to and from chip 130. It should be noted that the total number of bonding pads 105 and the total number of bonding pads 145 on substrate 100 may be equal, but the density of pads 105 may be much greater than the density of pads 145. For illustrative purposes, only a few of the total number of bonding pads on the upper and lower surfaces of substrate 100 are shown in FIG. 1A. Moreover, only one trace conductor 150 is shown for the sake of brevity.

Figure 1B:
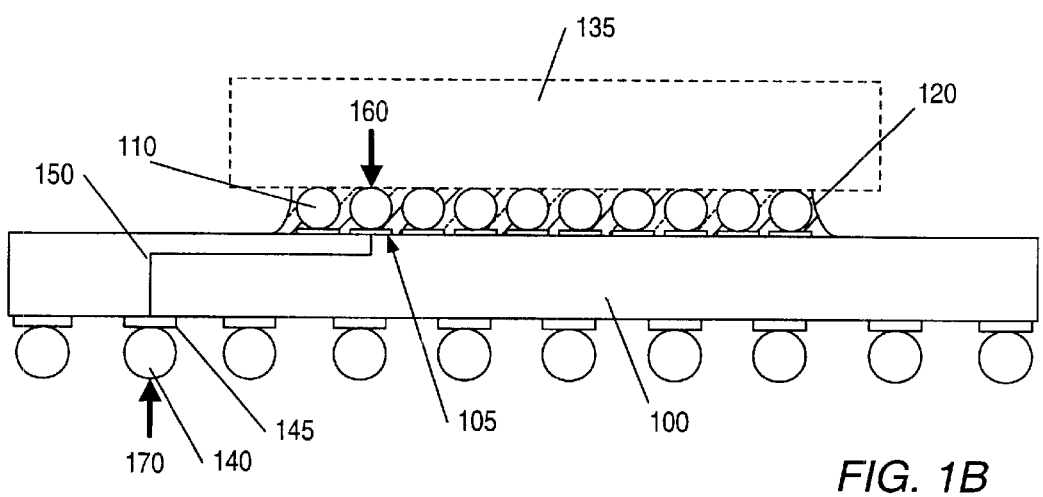
FIG. 1B is a cross-sectional view of the semiconductor package after removal of an overlying integrated circuit.

FIG. 1B is another cross-sectional view of an embodiment of semiconductor package 102. Dotted box section 135 indicates the removal of chip 130, which may be removed as described above. For example, the overlying heat spreader (not shown) and stiffener (not shown) portions of the package may be removed by wedging a razor blade between two consecutive layers of the semiconductor package. The razor blade may be worked around the periphery of the semiconductor package to separate and remove the heat spreader and stiffener package layers. The integrated circuit chip may be removed by placing the package in a heater block until the die attach material begins to soften. The die may then be lifted from the surface of the substrate. In this manner, solder bumps 110 may be exposed on the upper surface of the package substrate. Probe points 160 and 170 may indicate the points of contact for an external testing device, which may be coupled to probe trace conductor 150 inside substrate 100. The terminals of trace conductor 150 may be contact points for the testing device and may include solder bump 110 and corresponding solder ball 140.

To determine whether a location of high resistance in trace conductor 150 resides, inside the substrate or on the surface of the substrate, a time domain comparative analysis such as Time Domain Reflectometry (TDR) may be employed. TDR testing may be done prior to removal of chip 130 as shown in FIG. 1A. In such testing, an incident electrical pulse may be transmitted along a trace conductor on the surface of the package substrate. When the pulse encounters a discontinuity in the electrical conductivity, the pulse may be reflected back. The time delay of the reflected pulse may be measured with an oscilloscope and may be compared to other known delays. For example, the measured TDR waveform may be compared and matched to either a characteristic waveform for a known discontinuity defect within the substrate or a markedly different characteristic waveform for a known discontinuity defect outside of the substrate. From this analysis, one can determine if the discontinuity is in (i) the package substrate, (ii) the solder ball connection to the trace conductor/test terminal, (iii) the solder bump connection to the trace conductor/opposing test terminal, or (iv) the integrated circuit itself.

Figure 1C:
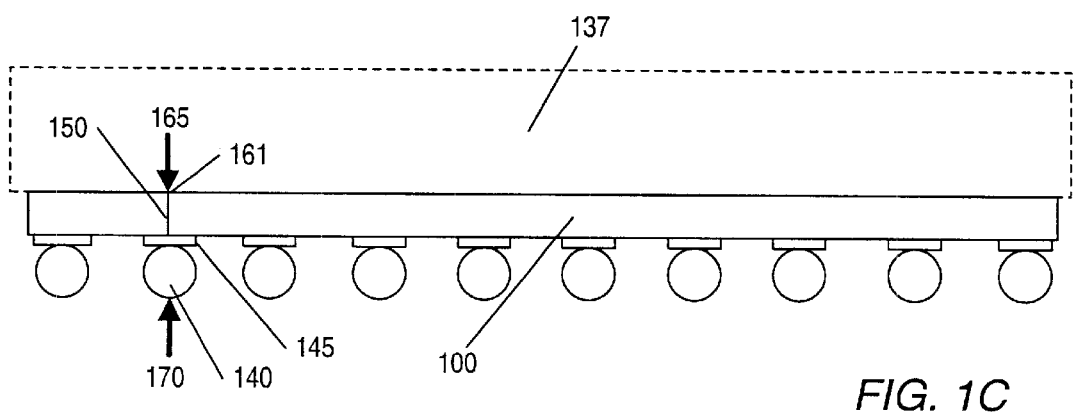
FIG. 1C is a cross-sectional view of the semiconductor package after removal of one or more layers of the package substrate.

FIG. 1C is another view of FIG. 1B in which a portion of substrate 100 is shown in phantom (box 137) as partially removed. Removing at least a portion of the substrate may include removing solder bump pads 105 by plasma etching. In addition, one or more layers of the substrate may be removed by mechanical grinding on a polishing wheel. It is important to stop grinding before the trace conductor is completely exposed to ensure that a deprocessing artifact is not introduced, since such an artifact may confuse the analyst. In another embodiment, an ashing process may be used to remove one or more layers of the substrate.

The subrate may be mounted onto a test fixture (as described below in FIGS. 2A and 2B), which may include an adjustable x-y table coupled to a single probe pin. The probe pin may contain a compressible spring for making a strong, but non-destructive contact with an electrical terminal on a lower surface of substrate 100. The electrical terminal 170 may be located at solder ball 140. A test device may be electrically coupled to electrical terminal 170 and also to a corresponding electrical terminus 161 of the trace conductor 150. The electrical terminus may be a solder bump or an upper end of an exposed trace conductor after removal of one or more layers of substrate 100. The test device may be a multi-meter device used for measuring electrical continuity of the trace conductor. As shown in FIG. 1C, probe point 165 indicates the new probe point at upper terminus 161 of trace conductor 150. Probe point 165 may, therefore, be used to detect possible open or short circuit conditions in the lower portion of trace conductor 150 if the upper portion of trace conductor 150 was previously removed. By comparing test results using probe point 160 with test results using probe point 165, a defective portion of the trace conductor may be determined. For instance, the resistance between points 160 and 170 may be greater than between points 165 and 170, thereby indicating a possible open circuit of the trace conductor in an upper planar region that may have been removed.

Figure 2A:
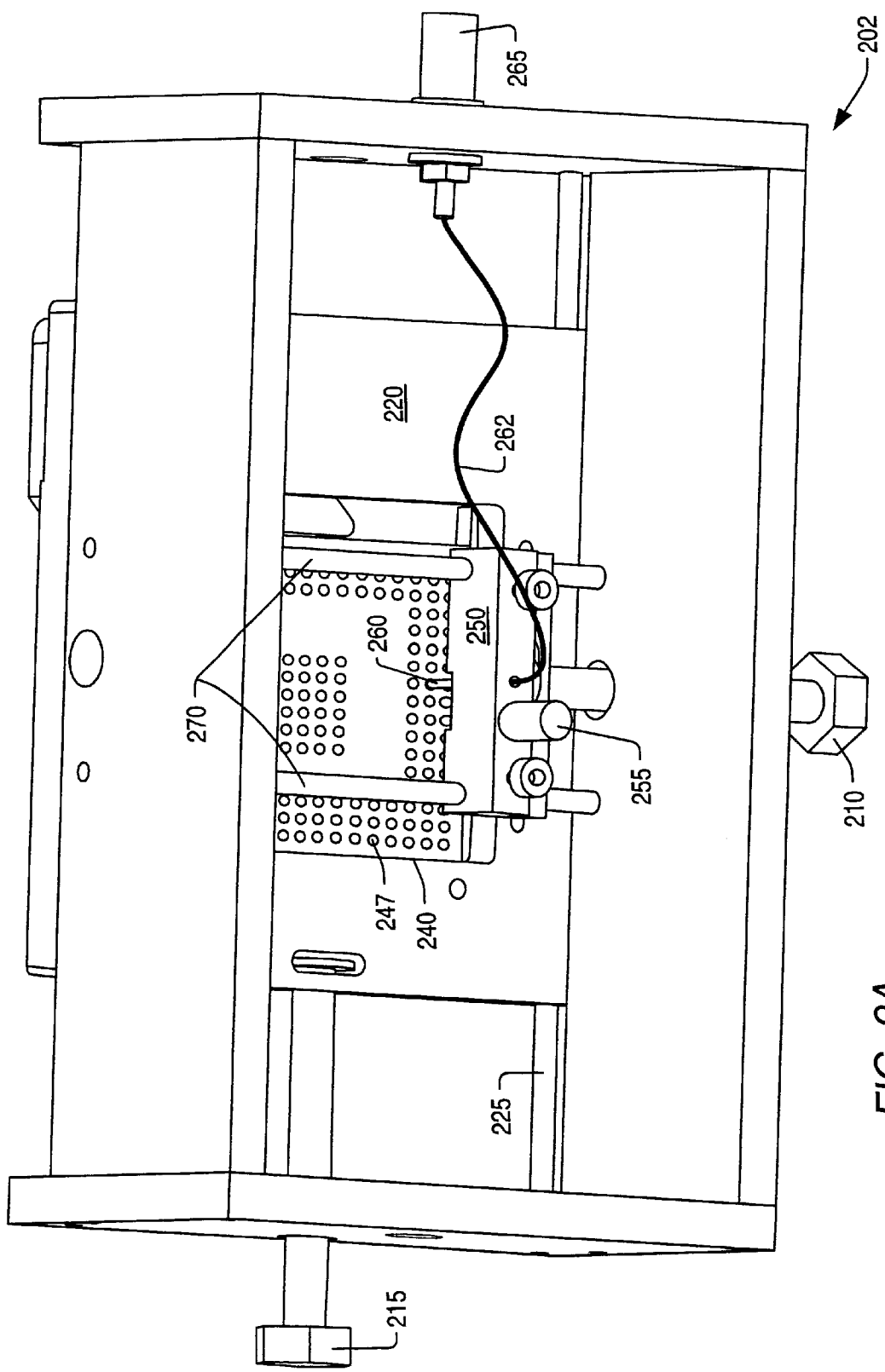
FIG. 2A is a bottom view of an embodiment of a probe fixture and a probe pin extending upward from a mechanism that is moveable in the x- and y-planes.

FIG. 2A is a bottom view of an embodiment of semiconductor package substrate probe fixture 202. Package holding table 220 may have a rectangular opening configured to expose solder balls 247 of package substrate 240. Moveable table 220 may slide on sliding rods 225 and may be coupled to lead screw 215. Probe pin 260 may extend upward from moveable pin retainer assembly 250. Retainer assembly 250 may be coupled to lead screw 210, which may be configured to alter a position of the retainer assembly. For example, lead screw 210 may slide assembly 250 on slide rods 270. In Probe pin 260 may also be adjusted in the vertical direction to make a mechanical and electrical contact with solder ball 247 by adjusting vertical height thumbscrew 255.

Probe pin 260 may be a pogo pin with an internal spring at the base. The internal spring may provide a firm contact on solder ball 247 while substantially preventing a destructive pressure from being applied to solder ball 247. Furthermore, probe pin 260 may be electrically coupled to electrical outlet socket 265 by electrical wire 262. By rotating lead screw 215, pin 260 may move in an x-axis direction. By rotating lead screw 210, pin 260 may move in a y-axis direction. By rotating thumbscrew 255, pin 260 may move in a z-axis direction, perpendicular to the x- and y-axes. As such, the distal end of pin 260 may be moved in small increments along all three axes relative to a solder ball on an underneath side of a package substrate. In this manner, pin 260 may frictionally engage a solder ball without employing a soldered connection and the problems associated therewith.

Figure 2B:
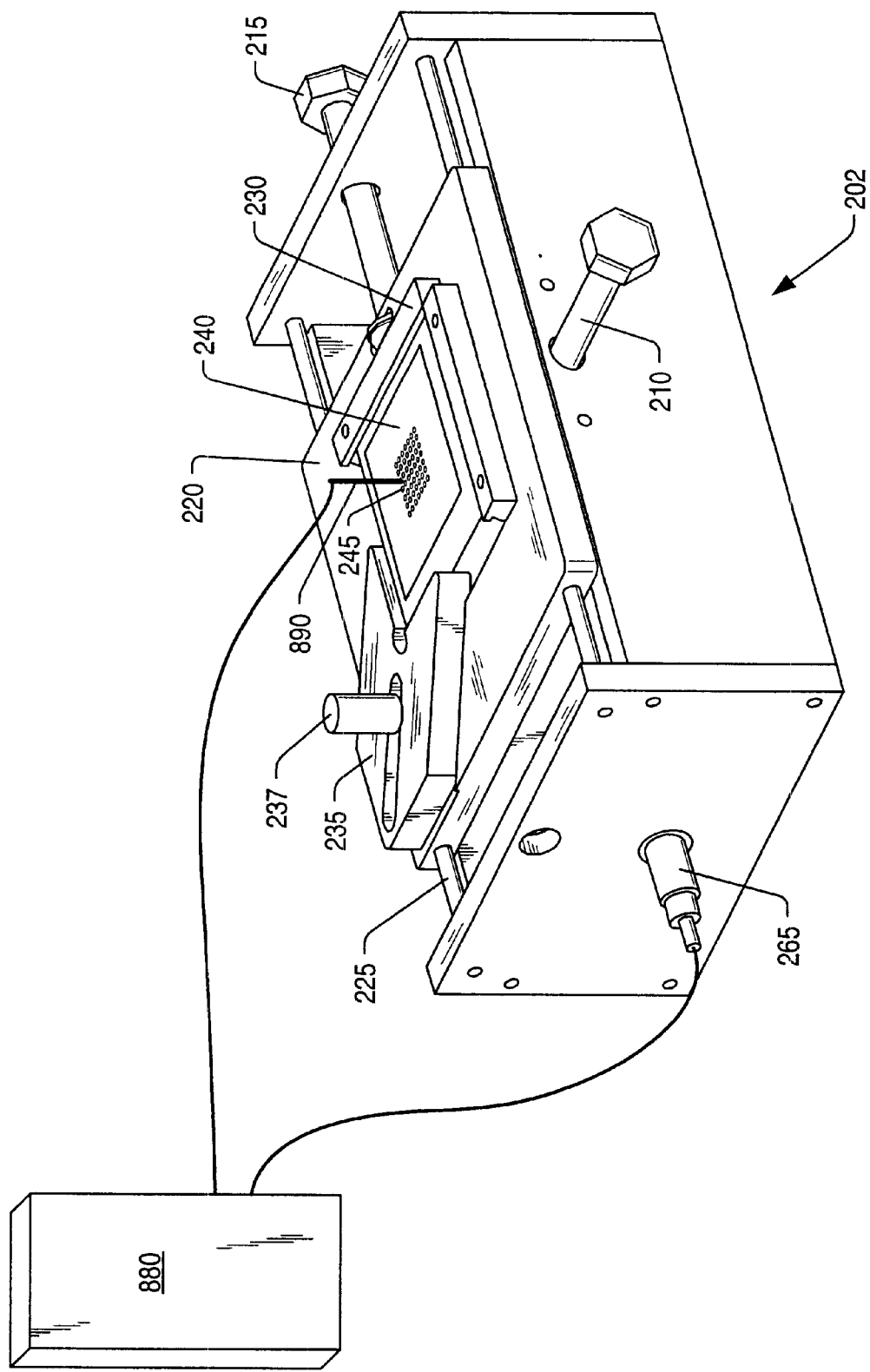
FIG. 2B is a top view of the probe fixture electrically connected to an electrical testing device.

FIG. 2B is top view of an embodiment of semiconductor package substrate probe fixture 202, which may be coupled to electrical testing device 880. Testing device 880 may be a multi-meter for measuring the electrical continuity of trace conductors inside package substrate 240. A probe wire originating from device 880 may be coupled to electrical outlet socket 265. Electrical outlet socket 265 may be electrically coupled to probe pin 260 underneath holding table 220, where probe pin 260 may be in contact with a solder ball terminal of a trace conductor. Another probe wire originating from device 880 may terminate in probe needle 890 and may be manually placed in electrical contact with an upper terminus (solder bump 245) of the trace conductor on the upper surface of substrate 240. A magnifying lens of 2× or 5× may be employed to locate and contact the upper terminus with probe needle 890. Probe package holding table 220 may be adapted to retain package substrate 240 by holding it into place against retainer walls 230 with sliding push plate 235. Sliding push plate 235 may be secured into place with thumbscrew 237. Table 220 is designed to conduct failure analysis by incorporating manual removal and attachment of the package substrate onto probe fixture 202.

Substrate 240 may be a multi-layer substrate with as many as eight or more layers. To locate a layer containing a defective portion of the trace conductor, the testing method may include removal of one or more substrate layers. For example, a testing procedure may include electrically testing substrate 240 with device 880. If the resistance measured is low, substrate 240 may be removed from fixture 202. An external lapping device may remove an upper layer of substrate 240. For example, one or more layers of the package substrate may be removed by mechanical grinding a with a polishing wheel in one embodiment. Alternatively, an ashing process may remove one or more layers of the substrate. After removing the upper layer, substrate 240 may be placed back into fixture 202 to measure the resistance of an underlying layer of substrate 240. The above procedure may be repeated until a defective layer may be found.

Figure 3A:
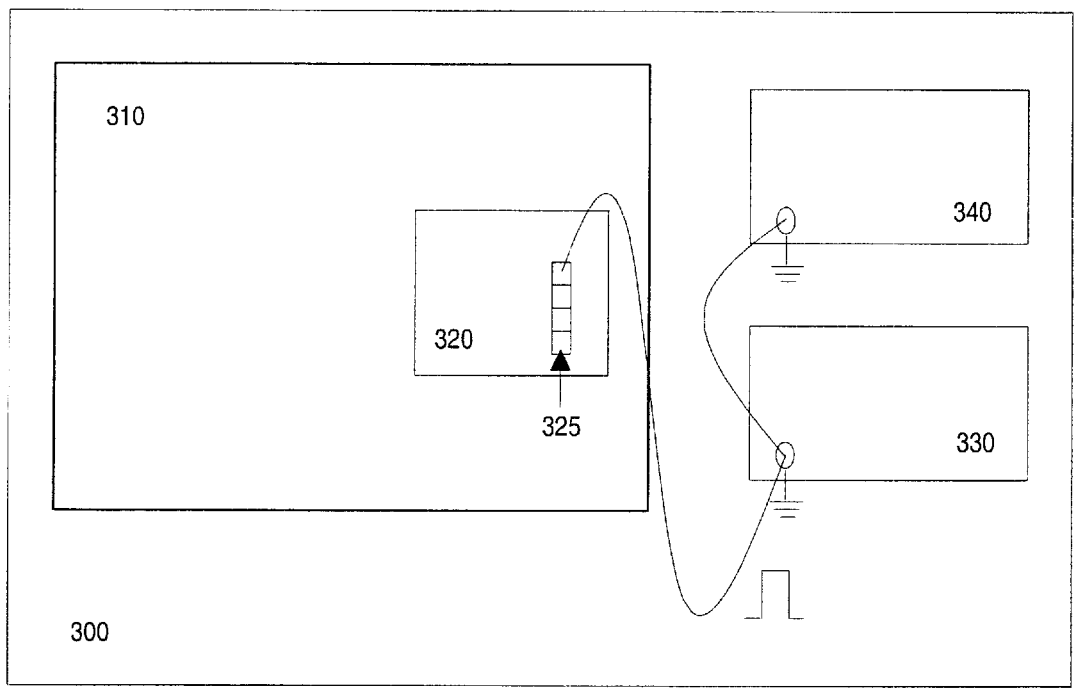
FIG. 3A is a schematic diagram of an embodiment of a testing system including a charged particle imaging device, load module, function generator, and oscilloscope.

FIG. 3A is a schematic diagram of an embodiment of a semiconductor package testing system. Testing system 300 may include charged particle imaging device 310, load module 320, function generator 330, and oscilloscope 340. As described above, once a defect is located on a layer of the package substrate by preliminary failure analysis, the substrate may be mounted in load module 320 to prepare the substrate for charged particle beam inspection. After the substrate is loaded into load module 320, a charged particle imaging device 310 may be used to image at least a portion of the package substrate. In one embodiment, charged particle imaging device 310 may be a Focused Ion Beam (FIB) system. Alternatively, charged particle imaging device 310 may be a Scanning Electron Microscopy (SEM) system. In this manner, an image of the semiconductor package may be obtained by supplying a beam of charged particles to at least a portion of the package substrate. The beam of charged particles may include positively charged gallium ($Ga^+$) ions in the case of a FIB system, or negatively charged electrons in the case of a SEM system. Function generator 330 may be coupled to load module input 325, and may be configured to supply an alternating square wave signal to at least a portion of the substrate. Function generator 330 may further be coupled to oscilloscope 340. Oscilloscope 340 may be configured to monitor the input signal supplied by the function generator to at least a portion of the package substrate.

Figure 3B:
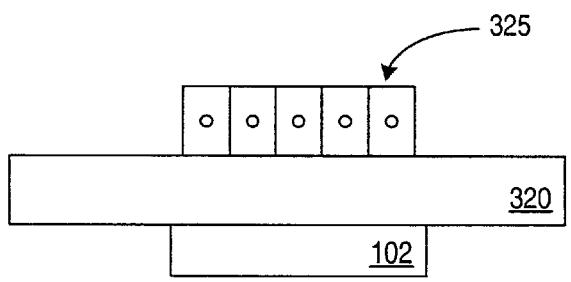
FIG. 3B is a cross-sectional view of an embodiment of a load module.

FIG. 3B is a cross-sectional view of an embodiment of load module 320. As described above, input 325 of load module 320 may be coupled to function generator 330 on the top side of load module 320. In addition, package substrate 102 may be coupled to load module 320 on the beam side of the load module. In this manner, package substrate 102 may be coupled to load module input 325, such that function generator 330 may supply the alternating signal to the package substrate by way of the load module.

Figure 3C:
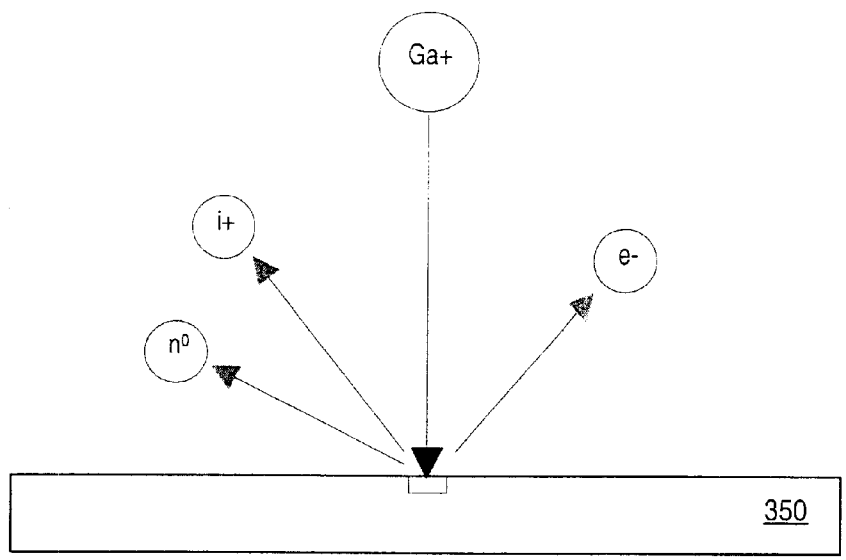
FIG. 3C is an illustration of a method by which a charged particle imaging system (e.g. a FIB system, in this case) may obtain an image of a sample.

For illustrative purposes, FIG. 3C describes the method by which a charged particle imaging system may obtain an image of a sample. For example, in a FIB system, a gallium primary ion beam may hit the surface of a sample to sputter a relatively small amount of material from sample 350. The sputtered material may leave the sample surface as either secondary ions ($i^+$ or $i^-$) or neutral atoms ($n^0$). The primary beam may also produce secondary electrons ($e^-$). As the primary beam rasters across the sample surface, a detector (not shown) may collect the sputtered ions or secondary electrons to form an image. In this manner, the beam of charged particles (or primary ion beam) may cause an emission of charged particles in the traces that are conducting electricity. Such an emission may cause the conducting traces in the image to brighten in contrast. Conversely, traces that are not conducting electricity may absorb charged particles, such that absorption may cause the non-conducting traces in the image to darken in contrast. Thus, the brightening and darkening of traces may produce a voltage-induced contrast image of a trace conductor corresponding to a failing pin of an integrated circuit.

Figure 4:
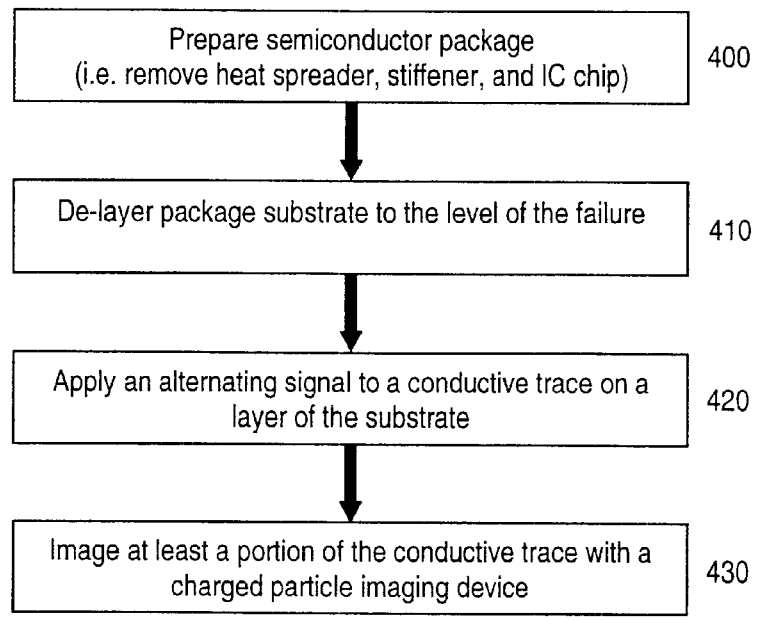
FIG. 4 is a flow chart diagram of an embodiment of a method for testing a semiconductor package.

FIG. 4 is a flow chart diagram of an embodiment of a method for testing a semiconductor package. As described above, the semiconductor package may be prepared by removing the heat spreader, stiffener, and IC chip (step 400) from the surface of the package substrate. A preliminary test using Time Domain Reflectometry may be performed to determine if a defect resides on the surface of the substrate or if a defect resides on an inner layer of the substrate. If the defect is determined to reside on an inner layer of the substrate, one or more layers of the substrate may be removed as described above until the defect may be exposed on an upper layer of the substrate (step 410). The substrate may be mounted in a load module to prepare for charged particle beam inspection of the trace conductors on the defective layer of the substrate. As shown in step 420, an alternating electrical signal may be applied to the trace conductors on the layer of the substrate in which the defect may be located. The electrical signal may be a square wave, having sharp transitional points to create an electrical pulse, which may serve to turn the signal "on" and "off" in an alternating fashion. An acceptable image of at least a portion of the trace conductor may be acquired with the charged particle imaging device (step 430) as described in FIG. 3B.

Figure 5:
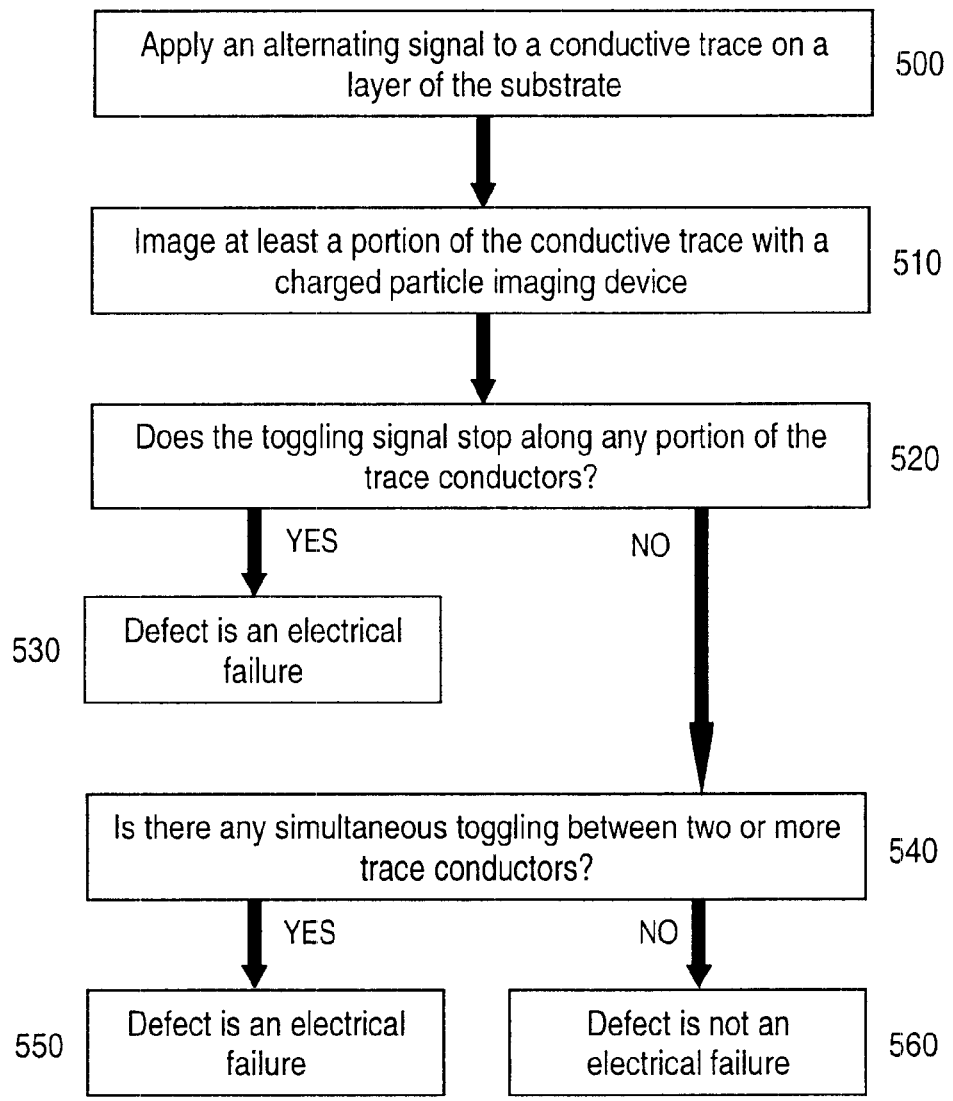
FIG. 5 is a flow chart diagram of another embodiment of a method for detecting electrical defects in a semiconductor package.

FIG. 5 is a flow chart diagram of another embodiment of a method for detecting electrical defects in a semiconductor package. After removing one or more layers of the package substrate, a defect may be determined to reside on a layer of the substrate. Subsequently, an electrical signal may be applied to a trace conductor on the layer of the substrate on which the defect may be located (step 500). In order to determine whether a defect may be an electrical failure, an image may be obtained of at least a portion of the trace conductor with a charged particle imaging device while the electrical signal may be applied to the trace conductor (step 510). The electrical signal may be an alternating square-wave signal, which may produce a toggling effect in the trace conductor. For example, the alternating square-wave signal applied to the trace conductor on a layer of the package substrate may produce an electrical pulse. The pulse may vary the electrical signal between on/off states. For the reasons stated above, the "on" state may cause a conducting trace in the image to brighten in contrast. Likewise, the "off" state may cause a non-conducting trace in the image to darken in contrast. Therefore, toggling may indicate that a trace is conducting the electrical signal, whereas a cease in toggling may indicate that a trace is not conducting the electrical signal.

In addition, the method for detecting electrical defects in a semiconductor package may include determining if a previously toggling signal stops along a portion of the trace conductor (step 520). If the toggling signal stops, cessation may indicate the presence of an electrical open in the conductive trace (step 530), thereby indicating an electrical failure in the semiconductor package. Furthermore, the method may also include determining if two or more trace conductors are toggling simultaneously (step 540). Simultaneous toggling of two or more trace conductors, having substantially identical contrasts, may indicate an electrical short between the traces (step 550), thereby indicating an electrical failure in the semiconductor package. Conversely, if the toggling signal travels the length of the trace conductor without stopping or contacting other trace conductors, the defect may not be an electrical defect (step 560). Such a defect may not disrupt the electrical continuity of the semiconductor package, and therefore, the defect may not require repair. In this manner, an operator may determine the presence of an electrical failure by observing the image as the alternating signal travels the length of a trace conductor. As an alternative embodiment, a computer system may be utilized to analyze signals representative of the image to determine if an electrical failure may be present in a trace conductor.

It will be appreciated to those skilled in the art having the benefit of this disclosure that this invention is believed to provide a method in which to test a semiconductor device package for defects, and to determine whether such defects are electrical or non-electrical failures. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A method for testing a semiconductor package, comprising:
   detecting a defect within any layer of a multiple-layer package substrate of the semiconductor package by detecting an electrical discontinuity in a trace conductor formed on a defective layer of the multiple-layer package substrate;
   applying a signal to a the trace conductor; and
   imaging at least a portion of the trace conductor with a charged particle imaging device to produce a voltage-induced contrast image of at least the portion of the trace conductor.

2. The method of claim 1, further comprising determining if the trace conductor comprises an electrical defect from the voltage-induced contrast image.

3. The method of claim 1, wherein the semiconductor package comprises a Ball Grid Array (BGA) package.

4. The method of claim 1, wherein the semiconductor package comprises a Flip-chip package.

5. The method of claim 1, further comprising preparing the semiconductor package prior to said detecting a defect by removing layers of the multiple-layer package substrate overlying the trace conductor.

6. The method of claim 1, wherein said determining a defect comprises:
   determining a failing pin on the semiconductor package, wherein an integrated circuit is coupled to the multiple-layer package substrate, and wherein the multiple-layer package substrate comprises a plurality of trace conductors arranged between electrical terminals of the multiple-layer package substrate and coupled to the failing pin;
   removing the integrated circuit from the multiple-layer package substrate to expose an upper surface of a first layer of the multiple-layer package substrate; and
   measuring an electrical resistance between trace conductors formed on the first layer to determine if the defect is present on the first layer of the multiple-layer package substrate.

7. The method of claim 6, further comprising:
   removing one or more layers of the multiple-layer package substrate below the upper surface if the defect is not present on the first layer to expose an underlying substrate layer;
   measuring an electrical resistance between the trace conductors formed on the underlying substrate layer; and
   repeating said removing and said measuring until the defect is determined to be present on the exposed underlying substrate layer.

8. The method of claim 7, wherein said removing comprises mechanical grinding on a polishing wheel.

9. The method of claim 7, wherein said removing comprises ashing of one or more substrate layers.

10. The method of claim 1, wherein the signal comprises an alternating signal, and wherein the alternating signal comprises a square wave function.

11. The method of claim 1, wherein the voltage-induced contrast image comprises a bright image of the trace conductor if the trace conductor conducts the signal, and wherein the voltage-induced contrast image comprises a dark image of the trace conductor if the trace conductor does not conduct the signal.

12. The method of claim 1, wherein the signal comprises an alternating signal, which varies between an "on" state and an "off" state, wherein the "on" state brightens the trace conductor in the voltage-induced contrast image, and wherein the "off" state darkens the trace conductor in the voltage-induced contrast image, the method further comprising producing a toggling in the trace conductor, wherein the toggling indicates that the trace conductor is conducting the signal, and wherein a cease in the toggling indicates that the trace conductor is not conducting the signal.

13. The method of claim 12, further comprising determining an electrical open in the trace conductor if the cease in the toggling is detected.

14. The method of claim 12, further comprising determining if an additional trace conductor is toggling simultaneously with the toggling of the trace conductor, wherein said simultaneous toggling indicates an electrical short between the trace conductor and the additional trace conductor.

15. The method of claim 1, wherein said charged particle imaging device comprises a Focused Ion Beam (FIB) system.

16. The method of claim 1, wherein said charged particle imaging device comprises a Scanning Electron Microscopy (SEM) system.

17. A method for detecting electrical defects in a semiconductor package, comprising:

detecting a defect within any layer of a multiple-layer package substrate of the semiconductor package by detecting an electrical discontinuity in a trace conductor formed on a defective layer of the multiple-layer package substrate;

producing an image of a portion of the semiconductor package comprising the defective layer; and determining if the defect is an electrical defect based on the image of the portion of the semiconductor package.

18. A The method of claim 17, wherein said producing an image comprises:

applying a signal to a trace conductor within the portion; and imaging the portion of the semiconductor package with a charged particle imaging device to produce a voltage-induced contrast image of the portion of the semiconductor package.

19. A system configured to detect electrical defects in a semiconductor package, comprising:

a function generator configured to supply a signal to a trace conductor of the semiconductor package;

an oscilloscope coupled to said function generator and configured to monitor said signal; and a charged particle imaging device configured to produce an image of a portion of the semiconductor package, wherein the image may detect electrical defects in the semiconductor package.

20. The system of claim 19, wherein the image comprises a bright image of the trace conductor if the trace conductor conducts the signal, and wherein the image comprises a dark image of the trace conductor if the trace conductor does not conduct the signal.

21. The system of claim 19, wherein said charged particle imaging device is further configured to produce a voltage-induced contrast image of the trace conductor.

22. The system of claim 19, wherein the signal comprises an alternating signal, and wherein the alternating signal comprises a square wave function.

* * * * *